(12) United States Patent
Tsutsumi et al.

(10) Patent No.: US 6,664,346 B2
(45) Date of Patent: Dec. 16, 2003

(54) PROTECTIVE FILM AND METHOD FOR PREPARING SAME

(75) Inventors: Katsuaki Tsutsumi, Oita (JP); Isao Hashimoto, Oita (JP)

(73) Assignee: Japan Polyolefins Co., Ltd., Tokyo (JP)

( * ) Notice: Subject to any disclaimer, the term of this patent is extended or adjusted under 35 U.S.C. 154(b) by 0 days.

(21) Appl. No.: 09/736,010

(22) Filed: Dec. 13, 2000

(65) Prior Publication Data

US 2002/0146582 A1 Oct. 10, 2002

(30) Foreign Application Priority Data

Aug. 13, 2000 (JP) ........................................ 2000-248447

(51) Int. Cl.⁷ .................................................. C08F 2/42
(52) U.S. Cl. ........................ 526/82; 526/83; 526/352.2
(58) Field of Search ................................ 526/352.2, 84, 526/82; 428/523

(56) References Cited

U.S. PATENT DOCUMENTS 3,987,020 A * 10/1976 Gropper et al. .......... 526/352.2

* cited by examiner

*Primary Examiner*—D. Lawrence Tarazano
(74) *Attorney, Agent, or Firm*—Dilworth & Barrese LLP

(57) ABSTRACT

A high-quality protective film for a dry film resist is provided. A film of a polyethylene is used as the protective film, the polyethylene being prepared by pressurizing ethylene with use of an ultra-high pressure compressor and then polymerizing the ethylene at a reaction temperature of 190° to 300° C. and a reaction pressure of not lower than 167 MPa in the presence of a radical polymerization initiator, or by pressuring ethylene with use of an ultra-high pressure compressor and then polymerizing the ethylene at a reaction temperature of 190° to 300° C. in the presence of a radical polymerization initiator while allowing a radical polymerization inhibitor to be present in the reaction system.

1 Claim, No Drawings

PROTECTIVE FILM AND METHOD FOR PREPARING SAME

FIELD OF THE INVENTION

The present invention relates to a protective film and a method for preparing a polyethylene for the film. More particularly, the invention is concerned with a protective film which is directly laminated to a film resist to protect the film resist, as well as a method for preparing a polyethylene for the film. The protective film is also sometimes called a masking film or a cover film.

BACKGROUND OF THE INVENTION

A film resist (also called a dry film resist) for forming a photosensitive layer used as an etching resist in the fabrication of a lead frame or a printed circuit board which are used in mounting a semiconductor integrated circuit, is generally constructed such that a positive or negative photosensitive composition is formed on a support film (a polyester film in many cases) and a protective film is laminated thereon. As photosensitive compositions are known those of an alkali development type in which an unexposed area (negative type) or an exposed area (positive type) is removed with an aqueous alkali solution and those of a solvent development type in which the said area is removed with an organic solvent. The photosensitive composition used is a solid, but is not so hard as its shape does not change, having a certain degree of dimensional deformation.

As an example, a description will be given below of a method of fabricating a printed circuit board or a lead frame in accordance with a metal etching process using an alkali development type film resist.

First, a protective film laminated directly onto a film resist is peeled off and the film resist is laminated to a metallic substrate such as a copper-clad laminate so as to become direct contact with the substrate by means of pressure rolls. Then, a desired pattern is printed to the film resist on the metallic substrate by exposure through a mask with the pattern plotted thereon.
By subsequent development using weak alkali water there is formed a resist pattern on the metallic substrate. The metallic substrate is then subjected to etching with the resist pattern as a mask and thereafter the resist pattern is peeled off using strong alkali water, whereby a printed circuit board or a lead frame is fabricated.

In the process of laminating the film resist to the metallic substrate after removal of the protective film, as pointed out in JP 11-153861A, there occur air voids in the interface between the metallic substrate and the film resist, and due to the presence of such air voids there may occur a pattern loss in forming the resist pattern or there may occur a circuit lead loss in etching the substrate. As mentioned also in the above reference, the thinner the film resist as a photosensitive layer, the more likely the occurrence of such air voids.

In the above reference there is made judgment on the basis of the number of air voids formed, but a more practical method involves forming a plotting pattern with a line width of several ten micrometers ($\mu$m) as a substitute for circuit and checking defects on the pattern.

As the material of the protect film, polyesters such as polyethylene terephthalate and polyolefins such as polypropylene and polyethylene are used in many cases, but in Comparative Example 1 described in the above reference a protective film formed of polyethylene is an undesirable example.

The protective film itself in the above reference is required to be improved. More particularly, in the above reference, as a property of the protective film, the number of fish-eyes not smaller than 80 $\mu$m is defined. In many cases, such large fish-eyes as are not smaller than 80 $\mu$m in diameter result from incorporation of undissolved and deteriorated portions of the material into the film, as noted also in the above reference.

However, in an effort to improve the protective film described in the above reference, even if an attempt is made to fabricate such a film as is small in the number of fish-eyes of even a smaller diameter, say, 30 $\mu$m or so, the cause of formation of such fine fish-eyes is not fully clear yet. Besides, even the relation between such fine fish-eyes and the formation of the foregoing air voids is not fully clear yet because of the very small size of the fish-eyes. In more particular terms, the measurement of fish-eyes is based on observation of film transmitted light, and unevenness of the film surface is not determined directly. Therefore, in the case of fish-eyes of a large diameter, there may be a correlation thereof with unevenness of the film surface and the shape thereof, but in the case of fine fish-eyes 30 $\mu$m or so in diameter, the fish-eyes merely indicate the trace of resin flow and may not bear a direct relation to unevenness of the film surface. Thus, it is actually difficult to judge whether such fine fish-eyes are correlated or not with unevenness of the film surface and the shape thereof. As a matter of course, it is difficult to judge whether the film permits the formation of the foregoing plotting pattern.

Further, the aforementioned adaptability as a protective film formed of polyethylene is difficult to be changed by changing the film forming method and film forming conditions. It is necessary to alter the essential properties of the polyethylene used. No matter how the film forming method and forming conditions from polyethylene may be changed, there is a limit to the improvement of the aforementioned adaptability as a protective film. By merely changing the film forming method and forming conditions it will be difficult to obtain a useful protective film. For example, even if polyethylene is merely filtered through a filter before or during film formation, no improvement is made in many cases. In the case of the foregoing large fish-eyes not smaller than 80 $\mu$m in diameter there is recognized a certain decreasing effect in their number by the adoption of physical removing means such as a filter, and thus it is presumed that there will be an essential difference from fine fish-eyes 30 $\mu$m or so in diameter.

OBJECT OF THE INVENTION

It is an object of the present invention to solve the above-mentioned problems. Particularly, it is an object of the invention to establish a method for preparing a polyethylene superior as a dry film resist protecting film for which a high-grade of protecting function is required and thereby provide a novel protective film, a method for fabricating the film, and a laminate using the film.

SUMMARY OF THE INVENTION

Having made, for achieving the above-mentioned object, earnest studies about a method for preparing a high pressure process low-density polyethylene and a polyethylene film formed using the polyethylene, the present inventors found out that a high reaction pressure and the presence of a radical polymerization inhibitor in a reaction system are related to achieving the above-mentioned object, and succeeded in greatly improving the suitability of the polyethylene film as a protective film for a dry film resist.

More specifically, the present invention, in the first aspect thereof, resides in a protective film formed from a polyethylene, the polyethylene being prepared by pressurizing ethylene with use of an ultra-high pressure compressor and then polymerizing the ethylene at a reaction temperature of 190° to 300° C. and a reaction pressure of not lower than 167 MPa in the presence of a radical polymerization initiator.

The present invention, in the second aspect thereof, resides in a protective film formed from a polyethylene, the polyethylene being prepared by pressurizing ethylene with use of an ultra-high pressure compressor and then polymerizing the ethylene at a reaction temperature of 190° to 300° C. in the presence of a radical polymerization initiator while allowing a radical polymerization inhibitor to be present in the reaction system at a ratio such that the concentration of the radical polymerization inhibitor at an outlet of the ultra-high pressure compressor is 5 to 1000 wt. ppm relative to the ethylene.

The present invention, in the third aspect thereof, resides in a protective film according to the above second aspect of the invention, wherein the reaction pressure in the polymerization of ethylene is not lower than 167 MPa.

The present invention, in the fourth aspect thereof, resides in a protective film according to the above second or third aspect of the invention, wherein the radical polymerization inhibitor is a phenolic compound or a quinone compound.

The present invention, in the fifth aspect thereof, resides in a protective film according to any of the above first to fourth aspect of the invention, wherein the ethylene polymerization is performed using an agitation vessel type reactor and at a condition which gives an intra-reactor average residence time of 5 to 30 seconds.

The present invention, in the sixth aspect thereof, resides in a protective film constituted by a film of a polyethylene, the polyethylene having an MFR of 0.3 to 30 (g/10 min) and a density of 0.913 to 0.930 (g/cm$^3$) and, as a 30 $\mu$m thick film thereof, having a haze of 1 to 50 (%) and containing not more than 40 fish eyes per 10 cm$^2$ which are not smaller than 30 $\mu$m and smaller than 0.20 mm in the major diameter and not more than 1.0 fish-eye per 1.0 m$^2$ which is not smaller than 0.20 mm in the major diameter.

The present invention, in the seventh aspect thereof, resides in a laminate comprising a film resist and the protective film mentioned in any of the above first to sixth aspects of the invention laminated directly to the film resist.

The present invention, in the eighth aspect thereof, resides in a method for preparing a polyethylene for a protective film, comprising pressurizing ethylene by means of an ultra-high pressure compressor and then polymerizing the ethylene at a reaction temperature of 190° to 300° C. and a reaction pressure of not lower than 167 MPa in the presence of a polymerization initiator.

The present invention, in the ninth aspect thereof, resides in a method for preparing a polyethylene for a protective film, comprising pressurizing ethylene by means of an ultra-high pressure compressor and then polymerizing the ethylene at a reaction temperature of 190° to 300° C. in the presence of a polymerization initiator while allowing a radical polymerization inhibitor to be present in the reaction system at a ratio such that the concentration of the radical polymerization inhibitor at an outlet of the ultra-high pressure compressor is 5 to 1000 wt. ppm relative to ethylene.

The present invention, in the tenth aspect thereof, resides in a method for preparing a polyethylene according to the above ninth aspect of the invention, wherein the ethylene polymerization is performed at a reaction pressure of not lower than 167 MPa.

The present invention, in the eleventh aspect thereof, resides in a method for preparing a polyethylene for a protective film according to the above ninth or tenth aspect, wherein the polymerization inhibitor is a phenolic compound or a quinone compound.

The present invention, in the twelfth aspect thereof, resides in a method for preparing a polyethylene for a protective film according to any of the above eighth to eleventh aspect of the invention, wherein the ethylene polymerization is performed using an agitation vessel type reactor and at a condition which gives an intra-reactor average residence time of 5 to 30 seconds.

The present invention, in the thirteenth aspect thereof, resides in a method for preparing a polyethylene for a protective film according to any of the above eighth to twelfth aspects, wherein the polyethylene has an MFR of 0.3 to 30 (g/10 min) and a density of 0.913 to 0.930 (g/cm$^3$) and, as a 30 $\mu$m film thereof, has a haze of 1 to 50 (%) and contains not more than 40 fish-eyes per 10 cm$^2$ which are not smaller than 30 $\mu$m and smaller than 0.20 mm in the major diameter and not more than 1.0 fish-eye per 1.0 m$^2$ which is not smaller than 0.20 mm in the major diameter.

The present invention, in the fourteenth aspect thereof, resides in a method for preparing a laminate, comprising pressurizing ethylene by means of an ultra-high pressure compressor, then polymerizing the ethylene at a reaction temperature of 190° to 300° C. and a reaction pressure of not lower than 167 MPa in the presence of a polymerization initiator to afford a polyethylene having an MFR of 0.3 to 30 (g/10 min) and a density of 0.913 to 0.930 (g/cm$^3$), having a haze of 1 to 50% as a 30 $\mu$m film thereof and containing not more than 40 fish-eyes per 10 cm$^2$ which are not smaller than 30 $\mu$m and smaller than 0.20 mm in the major diameter and not more than 1.0 fish-eye per 1.0 m$^2$ which are not smaller than 0.20 mm in the major diameter, and laminating the polyethylene film directly as a protective film to a film resist.

The present invention, in the fifteenth aspect thereof, resides in a method for preparing a laminate, comprising pressurizing ethylene by means of an ultra-high pressure compressor, then polymerizing the ethylene at a reaction temperature of 190° to 300° C. in the presence of a polymerization initiator while allowing a radical polymerization inhibitor to be present in the reaction system at a ratio such that the concentration of the radical polymerization inhibitor at an outlet of the ultra-high pressure compressor is 5 to 1000 wt. ppm relative to ethylene to afford a polyethylene having an MFR of 0.3 to 30 (g/10 min) and a density of 0.913 to 0.930 (g/cm$^3$), having a haze of 1 to 50% as a 30 $\mu$m film thereof and containing not more than 40 fish-eyes per 10 cm$^2$ which are not smaller than 30 $\mu$m and smaller than 0.20 mm in the major diameter and not more than 1.0 fish-eye per 1.0 m$^2$ which is not smaller than 0.20 mm in the major diameter, and laminating the polyethylene film directly as a protective film to a film resist.

The present invention, in the sixteenth aspect thereof, resides in a method for preparing a laminate, comprising pressurizing ethylene by means of an ultra-high pressure compressor, then polymerizing the ethylene at a reaction temperature of 190° to 300° C. and a reaction pressure of not lower than 167 MPa in the presence of a polymerization initiator while allowing a radical polymerization inhibitor to be present in the reaction system at a ratio such that the concentration of the radical polymerization inhibitor at an outlet of the ultra-high pressure compressor is 5 to 1000 wt. ppm relative to ethylene to afford a polyethylene having an MFR of 0.3 to 30 (g/10 min) and a density of 0.913 to 0.930 (g/cm$^3$), having a haze of 1 to 50% as a 30 μm film thereof and containing not more than 40 fish-eyes per 10 cm$^2$ which are not smaller than 30 μm and smaller than 0.20 mm in the major diameter and not more than 1.0 fish-eye per 1.0 m$^2$ which is not smaller than 0.20 mm in the major diameter, and laminating the polyethylene film directly as a protective film to a film resist.

DETAILED DESCRIPTION OF THE INVENTION

The present invention will be described in detail hereinunder.

The polyethylene used for forming the protective film of the present invention is prepared by a high-pressure radical polymerization of ethylene using, for example, an organic peroxide or oxygen as a radical polymerization initiator.

The high-pressure radical polymerization process generally comprises pressurizing ethylene by means of an ultra-high pressure compressor, then introducing the ethylene into a tubular reactor or an agitation vessel type reactor, allowing the ethylene to be polymerized in the presence of a radical polymerization initiator, and subsequently releasing the pressure to afford a polyethylene.

The radical polymerization initiator is a free radical generating compound, examples of which include oxygen and organic peroxides such as t-butylperoxy pivalate, t-butylperoxy octoate, t-butylperoxy acetate, and t-butylperoxy benzoate. The radical polymerization initiator is poured into the reactor by a conventional method.

The pressurization of ethylene is effected usually by a two-step compression using a high-pressure compressor and an ultra-high pressure compressor. It is the high-pressure compressor that pressurizes ethylene up to about 10~40 MPa and it is the ultra-high pressure compressor that further pressurizes ethylene up to the reaction pressure. The ethylene leaving the ultra-high pressure compressor is introduced into the reactor and is polymerized therein. As the reactor there may be adopted either the foregoing tubular reactor or agitation vessel type reactor, the latter being preferred.

The reaction temperature in the ethylene polymerization is in the range of 190° to 300° C., preferably 200° to 280° C., more preferably 210° to 265° C. If the reaction temperature is outside the above range, a polymer-to-polymer crosslinking reaction is accelerated and the fish-eye density increases. A lower limit value of the polymerization reaction temperature represents the temperature of a portion where the polymerization proceeds and a relatively clear rise of temperature is recognized downstream of the portion where ethylene gas and the polymerization initiator contact each other for the first time within the reactor, while an upper limit value of the polymerization reaction temperature represents the maximum temperature in the reactor.

A suitable type and amount of a polar monomer, e.g., vinyl acetate or (meth)acrylic acid ester, may be copolymerized with ethylene insofar as the performance as a protective film is not impeded.

In the ethylene polymerization according to the present invention it is important that the polymerization be performed at a certain reaction pressure or higher. The reaction pressure means the lowest pressure in the reactor; more specifically, it is not lower than 167 MPa, preferably not lower than 190 MPa. If the reaction pressure is lower than 167 MPa, there will arise a region in the reactor in which region there occurs phase separation between part of the ethylene and a concentrated polyethylene phase. As a result, the polyethylene-to-polyethylene contact probability increases in the concentrated polyethylene phase and it becomes easier for the polyethylene crosslinking reaction to take place. Thus, at a pressure lower than 167 MPa, it is difficult to diminish fine fish-eyes. If the reaction pressure is not lower than 167 MPa, the interior of the reactor is maintained at a uniform phase, so that the crosslinking reaction is difficult to occur. As to the polymerization pressure, the higher, the better. But a substantial upper limit of the reaction pressure is 393 MPa or so because a limit is encountered in the withstand pressure of various devices disposed in the process.

The feed rate of the reaction feedstock is controlled so that an intra-reactor average residence time in the polymerization is in the range of 5 to 30 seconds, preferably 8 to 25 seconds, more preferably 10 to 18 seconds. If the average residence time is shorter than 5 seconds, unreacted radical polymerization initiator will flow out downward of the reactor, thus causing reaction to be started within a pipe not held in a satisfactory state of agitation or in a separator. If the initiator decomposes in an unsatisfactory state of dispersion, the polymer will be crosslinked locally and form fish-eyes, which may lead to the occurrence of an abnormal reaction. If the average residence time is longer than 30 seconds, the crosslinking will be accelerated because the polymer produced is exposed a long time to a free radical-containing environment. The "intra-reactor average residence time" stands for a value obtained by dividing an internal volume (m$^3$) of the reactor by a volume flow rate (m$^3$/sec) of the total ethylene gas entering the reactor.

In the ethylene polymrization according to the present invention, it is preferable that a polymerization inhibitor be present within the reactor, in addition to setting the reaction pressure at 167 MPa or higher. By combining these two means it is possible to synergistically attain the reduction of fish-eyes, especially fine fish-eyes.

The amount of the polymerization inhibitor added into the reaction system is in the range of 5 to 1000 wt. ppm, preferably 50 to 500 wt. ppm, more preferably 100 to 300 wt. ppm, relative to ethylene. It goes without saying that a suitable amount thereof should be selected so as not to impede the polymerization of ethylene monomer itself. Though somewhat different depending on the degree of the polymerization inhibiting effect of the polymerization inhibitor used, a smaller amount of the polymerization inhibitor than the lower limit will not attain a satisfactory fish-eye reducing effect, and a larger amount thereof than the upper limit is not practical because the fish-eye reducing effect will reach the ceiling and the amount of the polymerization initiator consumed will increase to a great extent. As will be noted later, since unreacted ethylene is recycled and reused, the flow rate thereof becomes maximum at the outlet of the ultra-high pressure compressor. The polymerization inhibitor is made present in the-reaction system at such a ratio as to give the above concentration thereof at the said outlet.

The polymerization inhibitor may be added at any suitable position as long as it is present in the reaction system. However, in the case where the polymerization inhibitor is added at a rear position with respect to the outlet of the ultra-high pressure compressor, it is necessary to use an ultra-high pressure pump for the addition of the polymerization inhibitor. Thus, it is preferred that the polymerization inhibitor be added at a front position with respect to the ultra-high pressure compressor. More specifically, the position where the polymerization inhibitor is to be added is before the inlet of the high-pressure compressor or downstream of the outlet of the high-pressure compressor and upstream of the inlet of the ultra-high pressure compressor. It is optional whether the polymerization inhibitor is to be added alone into the reaction system or to be added as a mixture thereof with a molecular weight modifier.

The polymerization inhibitor to be present in the reaction system is not specially limited if only it is an ethylene radical polymerization inhibitor. Examples are phenolic compounds and quinone compounds, including hydroquinone, monomethyl ether hydroquinone, 2,6-di-t-butyl-4-methylphenol, 2,6-di-t-butyl-4-ethylphenol, 3,5-bis(1,1-dimethyl ethyl)-4-hydroxybenzenepropionic acid octadecyl ester, thiobisphenol, quinone, and 4-t-butylpyrocatechol. Particularly preferred are monomethyl ether hydroquinone, 2,6-di-t-butyl-4-methylphenol, and 2,6-di-t-butyl-4-ethylphenol, which are relatively low in molecular weight, not too large in polarity, and are superior in dispersibility into ethylene. More preferred are 2,6-di-t-butyl-4-methylphenol and 2,6-di-ti-butyl-4-ethylphenol which do not inhibit the polymerization reaction to an excess degree. These polymerization inhibitors may be used each alone or as a combination of two or more. The polymerization inhibitor used may be added as a solution in a solvent into the reaction system. As examples of the solvent are mentioned saturated hydrocarbons having 6 to 14 carbon atoms. As the case may be, two or more of these solvents may be combined and used. Preferred solvents are those which are good solvents for the polymerization inhibitor used and which do not exert any bad influence on the polymerization system. Further, it is preferable to select such a solvent as remains in as small an amount as possible in the polymer, taking into account its boiling point and separation efficiency from the polymer.

In carrying out the polymerization there may be used a molecular weight modifier as necessary. As the molecular weight modifier there may be used any of various chain transfer agents. As examples of chain transfer agents are mentioned olefin compounds such as propylene, butene, and hexene, paraffins such as ethane, propane, and butane, and aromatic hydrocarbons such as toluene, xylene, and ethylbenzene.

If pressure is released after the end of the polymerization, there is obtained a desired polyethylene, e.g., a polyethylene having an MFR [JIS K 6760 (temperature: 190° C., load: 2.16 kg) of 0.3 to 30 (g/10 min) and a density of (JIS K 6760) of 0.913 to 0.930 (g/cm$^3$). Unreacted ethylene which is recovered upon release of pressure can be recycled and reused after being pressurized again. It suffices for the polyethylene thus obtained to have an MFR of 0.3 to 30, preferably 1 to 10, more preferably 2 to 5. If its MFR is outside this range, it will become difficult to form a film of the polyethylene stably. Likewise, it suffices for the polyethylene to have a density of 0.913 to 0.930, preferably 0.918 to 0.930, more preferably 0.920 to 0.928. If the density of the polyethylene is lower than 0.913, the stiffness of the resulting film will be lowered and the working efficiency may become too low, while if the polyethylene density exceeds 0.930, the flexibility of the resulting film will be deteriorated and there may arise a problem in point of close adhesion of the film when used as a protective film.

As a method for forming a film to be used as a protective film there may be adopted a known film forming method. For example, there may be adopted an inflation method (air- or water-cooling) or a T-die method. As the case may be there may be added a stretching process such as uniaxial stretching or biaxial stretching. The film forming temperature and haul-off speed are not specially limited, but are suitably in the range of 130° to 230° C. and in the range of 5 to 40 m/min, respectively. A suitable film thickness is selected, but as a protective film the film thickness is preferably in the range of 10 to 100 $\mu$m, more preferably 15 to 50 $\mu$m. The polyethylene which constitutes the protective film of the present invention may be blended with a polyolefin resin such as a liner low-density polyethylene, a high-density polyethylene, an ethylene-propylene copolymer, or an ethylene-butene copolymer, insofar as the conditions defined for fish-eye, etc. in the invention are not badly influenced. Where required, additives usually employed in the preparation of polyolefins such as antioxidant, anti-blocking agent, lubricant, antistatic agent, and ultraviolet ray absorber.

When the polyethylene is prepared in the presence of a radical polymerization inhibitor in the polymerization reaction system, a certain amount of the radical polymerization inhibitor remains in the resulting product. This residual radical polymerization inhibitor also possesses an oxidation preventing ability, and if the concentration thereof is sufficient, the addition of an antioxidant into the polyethylene product may be omitted.

The protective film of the present invention formed from the polyethylene thus prepared has a haze (determined in accordance with JIS K 7105) of 1 to 50 (%) and contains not more than 40 fish-eyes per 10 cm$^2$ which are not smaller than 30 $\mu$m and smaller than 0.20 mm in the major diameter and not more than 1.0 fish-eye per 1.0 m$^2$ which are not smaller than 0.20 mm in the major diameter.

The "fish-eye" means an optically non-uniform region observed from film transmitted light. Fish-eyes of a large diameter, say, 80 $\mu$m or so, are foreign matters in many cases. However, fish-eyes of a very small diameter, say, 30 $\mu$m or so, have not been made fully clear yet because of a very small diameter thereof. Thus, the cause of formation of such fine fish-eyes is uncertain and a satisfactory cure has not been developed yet. Besides, fine fish-eyes as an optically non-uniform region observed from transmitted light are not presumed to be directly correlated with the generation of air voids.

Fish-eyes (large fish-eyes) not smaller than 0.20 mm in terms of the major diameter are mainly caused by an oxidatively deteriorated resin. It is preferable that there be no such large fish-eyes because they would exert a serious influence on the film smoothness. The number of such large fish-eyes should be not larger than 1.0 pc./1.0 m$^2$, preferably not larger than 0.5 pc./1.0 m$^2$, more preferably not larger than 0.3 pc./1.0 m$^2$. An upper limit of the major diameter of such large fish-eyes should be 1.5 mm or so from the standpoint of preventing serious poor appearance and poor close adhesion.

On the other hand, as to fish-eyes smaller than 0.20 mm in terms of the major diameter, the number of fish-eyes (small fish-eyes) not smaller than 30 $\mu$m and smaller than 0.20 mm in the major diameter is not larger than 40 per 10 cm$^2$, preferably not larger than 10 per 10 cm$^2$, more preferably not larger than 2 per 10 cm$^2$. A lower limit of the number of small fish-eyes is usually 0.05 pc./10 cm$^2$ from the standpoint of management of film manufacturing conditions. The above range of the number of small fish-eyes substantially corresponds to 5 pc./m$^2$ or less as the number of fish-eyes not smaller than 80 $\mu$m in diameter. It is recognized that as the fish-eye diameter decreases, the number of fish-eyes increases progressively. Therefore, even if the number of 80 $\mu$m fish-eyes is zero, a considerable number of fish-eyes 30 μm or so in diameter are usually present (even if it is taken into account that the measurement of such fine fish-eyes as 30 μm is difficult).

The density of fish-eyes in the film of the invention is determined from a 30 μm thick film formed under the conditions of set extruder temperatures of 130~150° C. in a cylinder portion, 150° C. in an adapter die portion, a haul-off speed of 20 m/min, and a blow-up ratio of 2.0, using an air-cooled type inflation film molding machine (extruder barrel dia. 45 mm, die dia. 80 mm, a product of Modern Machinery Co.), within a simple clean room (cleanness: Federal Standard 209D Class 10000).

Fish-eyes are measured in the following manner.

Large fish-eyes not smaller than 0.20 mm in the major diameter are measured by in-line measurement using a laser counter or a CCD camera attached to a film forming machine, while small fish-eyes not smaller than 30 μm and smaller than 0.20 mm are measured in accordance with a method wherein an image in transparent mode is subjected to off-line analysis using a CCD scanner with a resolution of 1600 dpi. The measurement area is not smaller than 30 $cm^2$ in the measurement of small fish-eyes not smaller than 30 μm and smaller than 0.20 mm in terms of the major diameter and is not smaller than 100 $m^2$ in the measurement of large fish-eyes not smaller than 0.20 mm in the major diameter. The respective actually counted numbers are converted to numbers per unit area.

An example of use of the protective film according to the present invention will now be described. As already explained, a dry film resist has a construction such that a resist layer formed of a photosensitive resin is formed on a base film of polyethylene terephthalate for example, and a polyethylene film as a protective film is laminated to an upper surface of the resist layer so as to be in direct contact with the resist layer. As the resist there may be used any of known resists employable as dry film resists. The thinner the film resist layer, the better, because the resolution is improved. Particularly, from the standpoint of resolution, a thinner resist layer has been demanded recently. The protective film of the present invention is suitable for lamination to a resist layer not larger than 30 μm, preferably not larger than 25 μm, in thickness. A lower limit value of thickness is not specially limited, but is usually not smaller than 0.1 μm, preferably not smaller than 1 μm.

The method of forming a resist film on a base film and subsequently laminating a polyethylene film to the resist film can be carried out in a known manner.

The following is an outline of a resist process using the laminate of film resist and polyethylene film thus obtained, more particularly, the laminate of protective film/film resist/base film.

First, as the film resist there may be used any of known film resists. For example, it can be such a film resist as is exemplified in the foregoing JP 11-153861A, which film resist is formed from a photosensitive composition containing (a) a binder polymer prepared by copolymerizing acrylic acid or methacrylic acid and an alkyl ester thereof as constituent monomers, (b) a monomer containing at least one photopolymerizable ethylenically unsaturated group in the molecule, and (c) a photopolymerization initiator. These ingredients may be commercially available ones.

As the base film (support film) there may be used a polyester film, e.g., a polyethylene terephthalate film. The thickness of the base film is not specially limited, but is usually selected from the range of 1 to 30 μm. The base film may also be a commercially available one.

The resist layer in the above laminate of protective film/film resist/base film is affixed to one metallic side of a metallic substrate so that the base film becomes the top layer while peeling off the protective film. That is, the resist layer is affixed to one metallic side of the metallic substrate so that the resist surface after removal of the protective film comes into contact with the metallic side. The metallic side of the substrate is polished beforehand suitably. Affixing of the resist layer to one metallic side of the substrate may be done using pressure rolls if necessary. The protective film which has been peeled off can be discarded or recycled. A polyethylene prepared by a high-pressure radical polymerization process comes into close contact with the resist surface, but the adhesion thereof to the resist is not high, in other words, its releasability is good. Thus, when the protective film is peeled off, there is little fear of the resist remaining on the protective film.

Next, ultraviolet ray or any other active ray is radiated to the film resist through a photomask having a desired pattern, causing part of the resist layer to be photocured or photo-decomposed correspondingly to the pattern, while allowing the residual resist layer to remain unchanged. Thereafter, in the case of a positive resist, the uncured resist layer portion is dissolved off using a developer such as an organic solvent or an aqueous alkali solution, while allowing the photocured resist layer portion to remain as it is. In this way a cured resist layer having a desired pattern can be formed on the substrate. Where required, etching is performed subsequently to form a circuitry, etc. on the metallic substrate.

The protective film of the present invention exerts no physical and chemical influence on the film resist surface with which it comes into direct contact. Besides, air voids are scarcely formed and consequently there scarcely arises a cured resist layer having a pattern loss at the time of pattern formation. Thus, the protective film of the invention is suitable as a protective film which comes into direct contact with the resist film. Further, as shown in the foregoing reference, the thinner the resist film, the easier the occurrence of such a defect as pattern loss, but in the case of the protective film according to the present invention, even when laminated to a dry film resist as thin as 30 μm or less, preferably 1 to 25 μm, there are few air voids formed and consequently there is little fear that a cured resist layer having a pattern loss may occur at the time of pattern formation.

EXAMPLES

The present invention will be described below by way of examples.

Example 1

Using a high-pressure process low-density polyethylene manufacturing equipment having an agitation vessel type reactor, under the conditions of reaction temperatures ranging from 210° C. in a lowest temperature portion to 265° C. in a highest temperature portion, a reaction pressure of 196 MPa, and an intra-reactor average residence time of 17 seconds, a solution of 2,6-di-t-butyl-4-methylphenol in iso-paraffin (concentration: 150 g/l) was fed at a position downstream of an outlet of a high-pressure compressor and upstream of an inlet of an ultra-high pressure compressor in such a manner that the concentration of 2,6-di-t-butyl-4-methylphenol in ethylene at an outlet of the ultra-high pressure compressor is 170 wt. ppm, to afford a polyethylene.

Prior to preparation of the object product, a similar product almost equal in MFR and density was produced over a period of not shorter than 8 hours to purge the interior of the process system thoroughly. For the portions present in the process from after resin pelletization to bagging, cleaning was performed to a thorough extent so as not to permit incorporation of residual polyethylene different in molecular weight, and also during bagging there were given dust-proof considerations as much as possible to prevent the entry of dust suspended in the air.

As a result, there was produced a lot of about 40T products. The products have uniform physical properties and quality because within the lot there is performed a homogenizing operation by dry blending.

Using the polyethylene thus prepared and while paying attention to the prevention of dust entry in the handling process and also to pre-cleaning of residues in a molding machine, a 30 μm thick film was formed in a simple clean room of cleanness class 10000 (Federal Standard 209D), by means of an air-cooled type inflation film molding machine (extruder barrel dia. 45 mm, full-flighted screw, mounted filter 120 mesh, die dia. 80 mm, a product of Modern Machinery Co.), under the conditions of set extruder temperatures of 130~150° C. in a cylinder portion, 150° C. in an adapter die portion, a haul-off speed of 20 m/min, and a blow-up ratio of 2.0.

As to the density of large fish-eyes not smaller than 0.20 mm in the major diameter, the number thereof was measured in-line during molding by means of a laser fish-eye counter (Laser Eye Model TPLS-J04T, a product of Yasukawa Electric Mfg. Co.) and was then converted to the number per predetermined unit area. A single measurement covered an area of 320 m$^2$. This measurement was conducted three times for each product lot and a mean value was calculated.

As to the density of small fish-eyes not smaller than 30 μm and smaller than 0.20 mm, the film obtained was cut into a size approximately equal to A4 size and an arbitrary portion was scanned in a transparent mode with a resolution of 1600 dpi using a CCD scanner (EPSON ES-2000), followed by analysis of the resulting image and subsequent conversion into the number per predetermined unit area. A single measurement covered an area of 33.3 cm$^2$. The measurement was made a total of three times and a mean value was calculated. The results of the fish-eye density measurements are shown in Table 1.

The polyethylene film was used as a protective film for a dry film resist and was found to be fully employable for a plotting pattern with a minimum stroke width of 20 μm.

The formation and judgment of the above plotting pattern were made in the following manner (this method was applied also to Examples and Comparative Examples which follow).

The polyethylene film (30 μm thick) was laminated as a protective film onto the resist in a laminate of 16 μm polyethylene terephthalate film (support film)/commercial film resist (20 μm).

This three-layer film laminate was laminated to a copper-clad laminate while peeling off the protective film. Thereafter, exposure, development, and etching were conducted by conventional methods using a line drawing pattern mask with a minimum stroke width of 20 μm to form a line drawing on the copper-clad laminate. The adaptability to the line drawing pattern was determined by observing the line drawing through a microscope.

Example 2

Using the same conditions and method as in Example 1 except that the solution of 2,6-di-t-butyl-4-methylphenol in isoparaffin was not charged into the reaction system, a polyethylene was prepared (about 80T) and film was formed from the polyethylene, followed by measurement. The results of fish-eye density measurements are shown in Table 1.

The polyethylene film thus formed was used as a protective film for a dry film resist and was found to be fully employable for a line drawing pattern with a minimum stroke width of 30 μm. However, there was recognized a partial inconvenience at a minimum stroke width of 20 μm.

Example 3

Using the same conditions and method as in Example 1 except that the reaction pressure was 173 MPa and the solution of 2,6-di-t-butyl-4-methylphenol in isoparaffin was not charged into the reaction system, a polyethylene was prepared (about 80T) and film was formed from the polyethylene, followed by measurement. The results of fish-eye density measurements are shown in Table 1.

The polyethylene film thus formed was used as a protective film for a dry film resist and was found to be employable for a line drawing pattern with a minimum stroke width of 75 μm. It could be used suitably as a general-purpose protective film for an acrylic sheet or the like (also in the following).

Example 4

Using a high-pressure process low-density polyethylene manufacturing equipment having a tubular type reactor and under the conditions of reaction temperatures ranging from 195° C. in a lowest temperature portion to 275° C. in a highest temperature portion and a reaction pressure of 240 MPa, a polyethylene was prepared (about 50T) in the same procedure as in Example 1, followed by film formation and measurement using the same conditions and methods as in Example 1. The results of fish-eye density measurements are shown in Table 1.

The polyethylene film thus formed was used as a protective film for a dry film resist and was found to be employable for a line drawing pattern with a stroke width of 75 μm. It could be used suitably as a general-purpose protective film.

Comparative Example 1

Polyethylene preparation, film formation, and fish-eye measurement were conducted in the same way as in Example 3 except that the reaction pressure was set at 150 MPa. The results of fish-eye density measurements are shown in Table 1.

When the polyethylene film thus formed was used as a protective film for a dry film resist, there partially occurred inconvenience even in a low-grade application of 100 μm or more in terms of a minimum stroke width.

Comparative Example 2

Polyethylene preparation (about 40T), film formation, and fish-eye measurement were conducted in the same way as in Example 3 except that the reaction temperature range was set at 175° C. in a lowest temperature portion to 305° C. in a highest temperature portion. The results of fish-eye density measurements are shown in Table 1.

When the polyethylene film thus formed was used as a protective film for a dry film resist, there partially occurred inconvenience even in a low-grade use of 100 μm or more in terms of a minimum stroke width.

Comparative Example 3

Polyethylene preparation (about 30T), film formation, and fish-eye measurement were conducted in the same way as in Example 3 except that the intra-reactor average residence time was set at 34 seconds. The results of fish-eye density measurements are shown in Table 1.

When the polyethylene film thus formed was used as a protective film for a dry film resist, it was found to be employable for a plotting pattern with a minimum stroke width of 100 μm or more. Further, it could be used suitably as a general-purpose protective film.

TABLE 1

| | MFR g/10 min | Density g/cm$^3$ | Haze % | Fish-eye 0.20 mm or more in major dia., pc/1.0 m$^2$ | Fish-eye 80 μm or more and smaller than 0.20 mm in major dia., pc/10 cm$^2$ |
|---|---|---|---|---|---|
| Example 1 | 3.4 | 0.925 | 14.1 | 0.25 | 0.5 |
| Example 2 | 3.6 | 0.925 | 13.2 | 0.37 | 7.8 |
| Example 3 | 3.5 | 0.924 | 16.7 | 0.26 | 38.2 |
| Example 4 | 3.0 | 0.926 | 9.7 | 0.87 | 37.5 |
| Comparative Example 1 | 3.5 | 0.923 | 25.4 | 1.54 | 432 |
| Comparative Example 2 | 3.3 | 0.923 | 30.1 | 3.26 | 522 |
| Comparative Example 3 | 3.3 | 0.924 | 15.4 | 0.51 | 147 |

* In Examples 1 to 4 and Comparative Example 3 the number of fish-eyes not smaller than 80 μm in the major diameter was not larger than 5 pc./m$^2$.

The presence and the number of fish-eyes not larger than 30 μm are difficult to change even by changing film forming method and conditions. It is necessary to alter the essential properties of the polyethylene used. This is because the cause of formation of such fine fish-eyes as not larger than 30 μm has not been made clear yet.

In the present invention, by polymerizing ethylene at a high pressure which permits polymerization in a homogeneous phase and by making a polymerization inhibitor present in the reaction system, it is possible to provide an effective and superior polyethylene film as a protective film even for a thin resist layer.

Thus, it turns out that the protective film according to the present invention is fully employable even for a plotting pattern with a minimum stroke width of 20°m.

Further, a low-density polyethylene prepared according to a high-pressure radical polymerization method is soft and so is superior in its close adhesion to a film resist surface and is therefore convenient for exhibiting a protecting function. Besides, since the releasability of such a low-density polyethylene from a film resist is good to a moderate extent despite its superior close adhesion, it can be laminated easily to a metallic substrate.

Thus, the polyethylene film prepared according to the present invention is suitable as a protective film.

What is claimed is:

1. A method for preparing a polyethylene for a protective film, which method comprises pressurizing ethylene by means of an ultra-high pressure compressor and then polymerizing the ethylene at a reaction temperature of 190° C. to 300° C. in the presence of a polymerization initiator while allowing a radical polymerization inhibitor to be present in the reaction system at a ratio such that the concentration of the radical polymerization inhibitor at an outlet of said ultra-high pressure compressor is 5 to 1000 wt. ppm relative to ethylene, wherein said polymerization inhibitor is a phenolic compound or a quinone compound.

\* \* \* \* \*